(12) United States Patent
Lin et al.

(10) Patent No.: US 6,713,365 B2
(45) Date of Patent: Mar. 30, 2004

(54) METHODS FOR FILLING SHALLOW TRENCH ISOLATIONS HAVING HIGH ASPECT RATIOS

(75) Inventors: Chin-Hsiang Lin, Hsinchu (TW); Lee-Jen Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/236,022

(22) Filed: Sep. 4, 2002

(65) Prior Publication Data

US 2004/0043581 A1 Mar. 4, 2004

(51) Int. Cl.[7] .................................................. H01L 21/76
(52) U.S. Cl. ........................ 438/424; 438/429; 438/430; 438/435
(58) Field of Search .................................. 438/424, 429, 438/430, 435

(56) References Cited

U.S. PATENT DOCUMENTS

| | | | |
|---|---|---|---|
| 5,726,090 A | * | 3/1998 | Jang et al. |
| 6,180,490 B1 | * | 1/2001 | Vassiliev et al. |
| 6,211,040 B1 | * | 4/2001 | Liu et al. |
| 6,300,219 B1 | * | 10/2001 | Doan et al. |
| 6,303,043 B1 | * | 10/2001 | Chen et al. |
| 6,448,149 B1 | * | 9/2002 | Lee et al. |

* cited by examiner

Primary Examiner—John F. Niebling
Assistant Examiner—Stanetta Isaac
(74) Attorney, Agent, or Firm—Stout, Uxa, Buyan & Mullins, LLP

(57) ABSTRACT

A method of forming an isolation trench for an integrated circuit on a semiconductor substrate includes providing a semiconductor substrate having a-pad oxide layer, a nitride layer, and a patterned photoresist layer, and removing portions of the nitride layer, pad oxide layer, and semiconductor substrate to form a trench. After the trench is formed, the patterned photoresist is removed and a first fill layer is formed inside of the trench. The first fill layer is then etched back using a wet spin etch, and a second fill layer is subsequently formed over the first fill layer.

22 Claims, 5 Drawing Sheets

METHODS FOR FILLING SHALLOW TRENCH ISOLATIONS HAVING HIGH ASPECT RATIOS

BACKGROUND OF THE INVENTION

1. Field of the Invention

The present invention relates generally to high density semiconductor devices and, more particularly, to methods of isolating semiconductor devices on a microchip.

2. Description of Related Art

Successful manufacture of high density integrated circuits, such as processors, controllers, and memories, relies upon the ability to isolate each individual device within a circuit from those surrounding it. Modem integrated circuits comprise millions of densely packed transistors, diodes, capacitors, and resistors formed on a single semiconductor substrate. Individual devices are isolated from one another to prevent phenomena such as current leakage or cross-talk between adjacent devices. Two standard methods of electrically isolating devices are local oxidation of silicon (LOCOS) and shallow trench isolation (STI).

In the LOCOS isolation process, a field oxide is grown in non-active regions of the semiconductor substrate. This isolation process has been widely used for isolating metal oxide semiconductor (MOS) devices such as NMOS, PMOS, and CMOS devices in previous generations of integrated circuits. However, LOCOS technology includes two limitations that can become increasingly pronounced as device dimensions shrink. In the LOCOS isolation process an oxide undergrowth known as a birds beak occurs at the edges of the field oxide regions, which can impose an undesirable limitation to device densities. Thus, the LOCOS isolation process may substantially restrict the maximum number of devices available in the manufacture of integrated circuits. The field oxide also extends vertically, creating a non-planar topography between the active and inactive regions. This non-planar topography may cause difficulties in later photolithographic processing such as problems resolving an image. As a result of these limitations, LOCOS technology can be ineffective for semiconductor processes involving devices dimensions, for example, below about 0.35 $\mu$m.

A process more suitable to the manufacture of ultra large scale integrated (ULSI) circuits, in which device dimensions fall below 0.35 $\mu$m, is STI In the STI process a trench is formed in a semiconductor substrate by forming protective layers and then etching through portions of those layers where isolation trenches are desired. Numerous steps are then performed to fill the trenches with an appropriate dielectric or combination of dielectrics. By etching almost vertically to form trenches having a dimension on the scale of a micron or sub-micron, valuable area can be preserved for the formation of a dense array of devices. A standard method utilized to form isolation trenches is referred to as the deposition 1, wet etch, deposition 2 technique, in which a first trench fill layer is formed inside a trench, a wet etch is performed to remove portions of the first trench fill layer, and a second trench fill layer is formed to completely fill the trench.

STI has become the preferred method of isolation for ULSI circuits, because it requires very little area on the semiconductor substrate thereby allowing devices to be more densely distributed. Denser distributions can enable the fabrication of circuits with enhanced speed and power. STI structures also possess a relatively planar topography, which can facilitate subsequent photolithographic processing and an attenuation of errors.

Unresolved problems in the manufacture of isolation trenches, however, can still limit device densities. One problem associated with current STI techniques is the formation of air gaps or voids in the trench fill layer. Such voids can occur, for example, at or below dimensions of about 0.25 $\mu$m and depths above about 0.4 $\mu$m. These voids can adversely effect electrical characteristics of adjacent devices and can be a mechanism for device failure. Therefore, a need exists in the art to create relatively narrow and/or relatively deep trench isolation structures without the formation of voids.

SUMMARY OF THE INVENTION

The present invention addresses this need by providing methods for manufacturing isolation trenches in which the possibility or probability of forming voids or air gaps in the trenches is attenuated or eliminated. Consequently, the formation of isolation trenches in accordance with the present invention can reduce failures in adjacent devices.

The invention herein disclosed provides methods of effectively controlling the formation of voids or air gaps by performing a wet spin etch treatment between fill layers. The wet spin etch treatment can provide selectivity between the lateral etch rate and the vertical etch rate, thereby producing or approaching minimal or desirable aspect ratios.

In accordance with an aspect of the present invention, a method for making at least one isolation trench for an integrated circuit on a semiconductor substrate comprises (a) providing a semiconductor substrate having a pad oxide layer, a nitride layer, and a patterned photoresist layer, (b) removing portions of the nitride layer, pad oxide layer, and semiconductor substrate to form at least one trench; (c) removing the photoresist; (d) forming a first fill layer inside the at least one trench; (e) etching back the first fill layer with a wet spin etch; and (f) forming a second fill layer over the first fill layer. An oxide liner may be formed on the walls and base of the trench after the photoresist is removed.

According to another aspect of the invention, a method of forming at least one isolation trench comprises providing a semiconductor substrate having at least one trench disposed therein, the at least one trench having a trench sidewall and a trench base; forming a first fill layer inside the at least one trench; performing an etch process wherein portions of the first fill layer are removed from the trench sidewall at a greater rate or to a greater extent than from the trench base; and forming a second fill layer over the first fill layer.

Portions of the nitride layer, pad oxide layer, and semiconductor substrate may be removed, for example, by an anisotropic etch or an anisotropic etch followed by an isotropic etch. The first fill layer may comprise an oxide formed by HDPCVD with $SiH_4$. A mixture of $SiH_4$ and $O_2$ may be implemented to form the oxide, the $SiH_4$ flow ranging from 50 to 100 SCCM, and the $O_2$ flow ranging from 80 to 150 SCCM. Deposition times may range from 10 seconds to 30 seconds. The second fill layer may also comprise an oxide formed by CVD, PECVD, or LPCVD. The formation of the second fill layer may comprise a first step of flowing 80 to 140 SCCM of $SiH_4$ and 130 to 200 SCCM of $O_2$, followed by a second step of flowing 110 to 180 SCCM of $SiH_4$ and 180 to 250 SCCM of $O_2$.

A dimension, such as a width, of the at least one trench may range from 0.25 to 0.18 $\mu$m. The spin speed of the wafer during the wet spin etch can be modified or tuned to create a wider top trench size and a smaller step height, thereby creating a lower aspect ratio of the resulting partially-filled trench. The wet spin etch may comprise a mixture of buffered oxide etch (BOE) and diluted hydrofluoric acid (DHF), the chemical composition ranging from a ratio of about 10:1 to about 500:1. Between 100 angstroms and 300 angstroms may be removed during the wet spin etch. During the wet spin etch, the wafer may be situated horizontally and spun horizontally, or, for example, situated vertically and spun vertically. The at least one trench may comprise a plurality of trenches.

A method in accordance with another aspect of the invention comprises (a) determining a geometrical characteristic of the isolation trench; and (b) generating a wet-spin etch recipe to be used in a deposition 1, wet spin etch, deposition 2 trench filling sequence, wherein the wet-spin etch recipe is generated based upon the determined geometrical characteristic. The geometric characteristic may be an aspect ratio of the isolation trench. The generating of the wet-spin etch recipe may comprise selecting a spin rate, wherein greater spin rates are selected for isolation trenches having relatively large aspect ratios and smaller spin rates are selected-for trenches having relatively small aspect ratios.

A method of filling isolation trenches may comprise, not necessarily in sequence, the steps of (a) performing a deposition 1, wet spin etch, deposition 2 trench filling sequence to fill a first trench having a first aspect ratio; and (b) performing a deposition 1, wet spin etch, deposition 2 trench filling sequence to fill a second isolation trench having a second aspect ratio; wherein the first aspect ratio is greater than the second aspect ratio; and wherein a spin rate of the wet spin etch in (a) is greater than a spin rate of the wet spin etch in (b).

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

DETAILED DESCRIPTION OF THE PRESENTLY PREFERRED EMBODIMENTS

Figure 1:
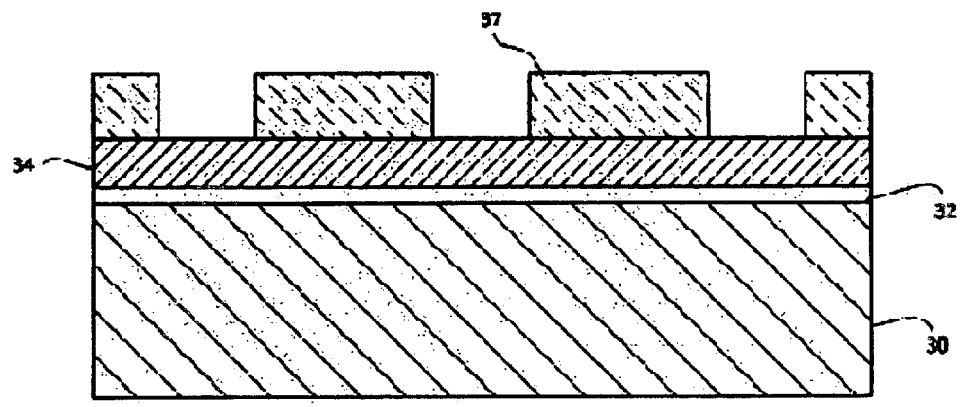
FIG. 1 is a cross-sectional view of an integrated circuit in an intermediate processing stage.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in greatly simplified form and are not to precise scale. In reference to the disclosure herein, for purposes of convenience and clarity only, directional terms, such as top, bottom, left, right, up, down, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. For example, it is understood by a person of ordinary skill practicing this invention that dielectric materials other than oxides may be used in addition to or in substitution of oxides to fill isolation trenches. It is likewise understood that liners other than oxide liners may also be used in isolation trenches.

It is to be understood and appreciated that the process steps and structures described herein do not cover a complete process flow for the manufacture of integrated circuits. The present invention may be practiced in conjunction with various integrated circuit fabrication techniques that are conventionally used in the art, and only so much of the commonly practiced process steps are included herein as are necessary to provide an understanding of the present invention.

Referring more particularly to the drawings, FIG. 1 illustrates a cross-sectional view of an integrated circuit in an intermediate processing stage according to the present invention. The integrated circuit comprises a semiconductor substrate 30, a pad oxide layer 32, a nitride layer 34, and a photoresist layer 37. The semiconductor substrate 30, which may be for example silicon, silicon germanium, or gallium arsinide, may be prepared by standard means such as cleaning the wafer, creating a denuded zone along the wafer's surface, etc. The pad oxide layer 32 may then be grown on the prepared semiconductor substrate 30 to a thickness of about 100 to 250 angstroms, or the pad oxide layer 32 may be deposited by chemical vapor deposition (CVD) to a comparable thickness.

The nitride layer 34, which may comprise for example silicon nitride, can subsequently be deposited by CVD onto the pad oxide layer 32. The nitride layer 34 can exhibit relatively slow rates of both oxidation and diffusion, thereby preventing the undesirable oxidation of the active regions of the semiconductor substrate 30 during the formation of isolation trenches. The nitride layer 34 may also serve as a barrier layer or polish stop during future processing steps. The pad oxide layer 32 is grown and/or deposited onto the wafer prior to deposition of the nitride layer 34 to act as a buffer and thereby relieve stress between the semiconductor substrate 30 and the nitride layer 34 caused by factors such as differing coefficients of expansion. The photoresist layer 37 may subsequently be applied to the nitride layer 34 and patterned in accordance with well known photolithographic principles understood in the art. As presently embodied, the patterned photoresist layer 37 may have open areas ranging from about 0.1 μm to about 1 μm in width and preferably ranging from about 0.20 μm to about 0.24 μm, corresponding to a desired dimension of the isolation trenches.

Figure 2:
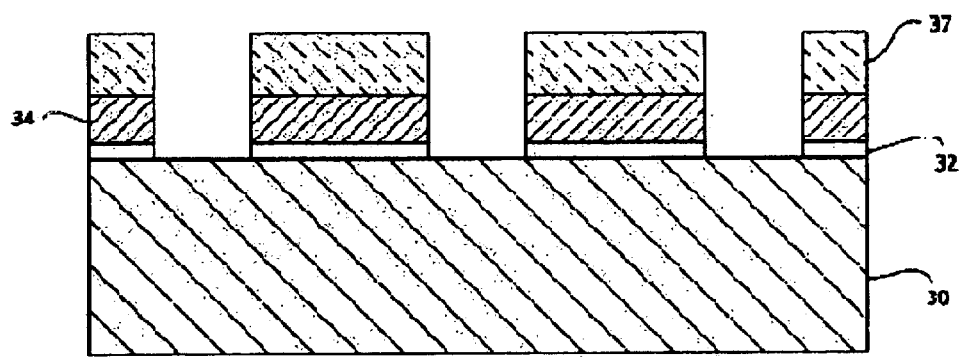
FIG. 2 is a cross-sectional view of the formations in FIG. 1 after an etch procedure.
Figure 3:
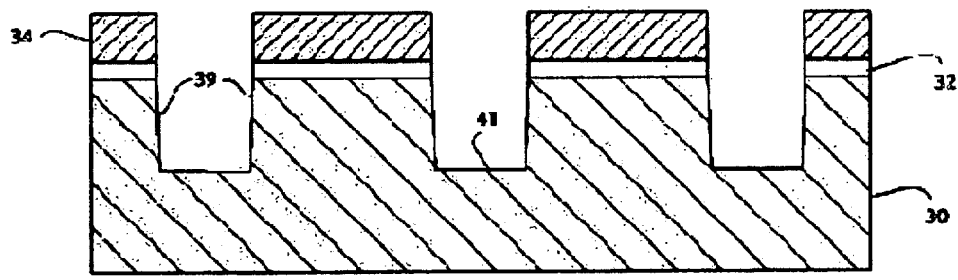
FIG. 3 is a cross-sectional view depicting the formations similar to those of FIG. 2 after trenches have been formed and a photoresist layer has been removed.

Referring to FIG. 2, the nitride layer 34 and pad oxide layer 32 are then isotropically and/or anisotropically etched using conventional methods, such as dry or wet etching, to thereby remove portions not covered by the photoresist layer. 37. As illustrated in FIG. 3 the isotropic and/or anisotropic etch may continue into the semiconductor substrate 30 to facilitate the formation of trenches having uniform depths of about 0.2 to 0.3 μm. Each trench may comprise two trench sidewalls 39 and a trench base 41 extending between the two trench sidewalls 39. In the illustrated embodiment the trench sidewalls 39 are sloped relative to the trench base 41, and the trench base comprises a generally planar surface extending substantially entirely between the trench sidewalls 39. The trench sidewalls may form angles from, for example, about 60 degrees to about 90 degrees from the trench base 41. In a modified embodiment, the corners joining the trench sidewalls 39 to the trench base 41 are rounded. The photoresist is thereafter removed by well known standard strip and ash procedures.

A thermal oxidation procedure can subsequently be performed to grow an oxide liner 43 on the trench sidewalls 39 and trench base 41 as shown in the cross-sectional view of FIG. 4. The oxide liner when used provide rounding to the trench shape and can be grown to a thickness between 400 and 600 angstroms. The oxide liner 43 can serve three primary functions: rounding of the trench shape, reduction of stress in the semiconductor substrate 30 induced by etching, and protection against oxide recess. The oxide liner 43 may additionally improve the silicon to silicon dioxide interface quality.

Figure 4:
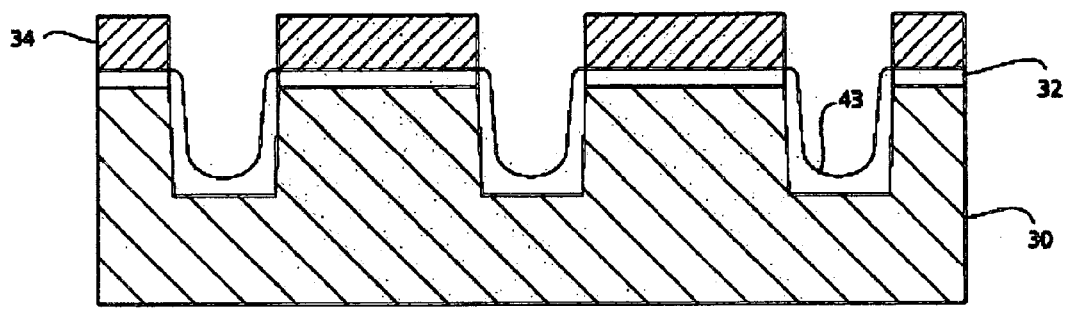
FIG. 4 is a cross-sectional view of FIG. 3 after the application of an oxide liner.
Figure 5:
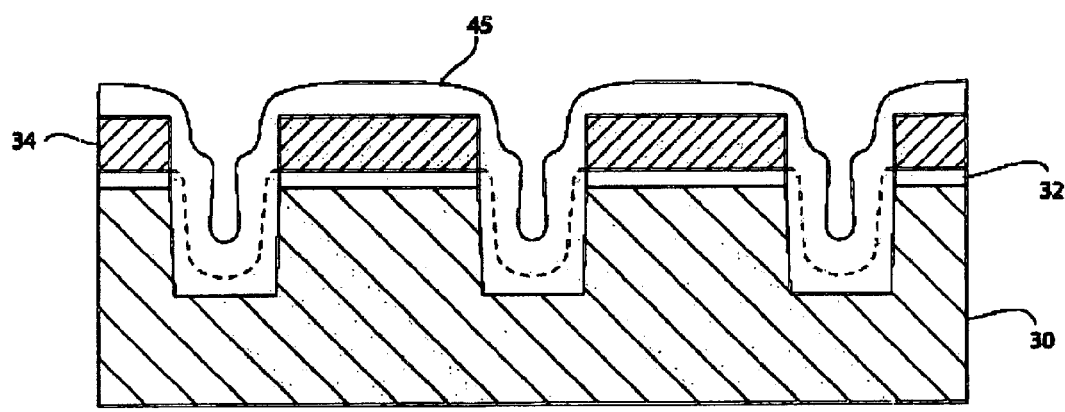
FIG. 5 is a cross-sectional view similar to FIG. 4 after a first oxide layer has been deposited.

FIG. 5 illustrates the formation of FIG. 4 after a subsequent first oxide deposition is performed to form a first oxide layer 45. Boundaries between adjacent oxide layers are shown in phantom. The first oxide layer 45 may be deposited by CVD, high density plasma chemical vapor deposition (HDPCVD), or sub-atmospheric chemical vapor deposition (SACVD) and is preferably deposited by HDPCVD using $SiH_4$ and $O_2$ in which the $SiH_4$ flow ranges from 50 to 100 standard cubic centimeters per minute (SCCM) and the $O_2$ ranges from 80 to 150 SCCM for a deposition time of 10 to 30 seconds. The resultant first oxide layer 45 preferably has a thickness of 1000 to 2000 angstroms at the trench base 41. The deposition thickness can be adjusted to attenuate any occurrence of overhang phenomenon and/or decrease the aspect ratio of the resulting trench. Portions of the first oxide layer 45 formed on the trench sidewalls 39 may be deposited more quickly along the trench lip than the trench bottom. This phenomenon can cause a problem known as reentrance, wherein the trench becomes narrower at its top than at its bottom.

A selective etch process is then performed wherein portions of the first oxide layer 45 are removed from the trench sidewalls 39 at a greater rate or to a greater extent than from the trench base 41. Consequently, a wider window can be achieved for the subsequent second oxide layer 55 deposition. In accordance with one aspect of the present invention, the initial deposition thickness of the first oxide layer 45 is engineered in combination with the selective etch process to generate a trench profile that will facilitate void-free filling with the second oxide layer 55.

In the illustrated embodiment, the selective (i.e., anisotropic) etch process comprises a wet spin etch wherein the wafer is submerged in a chemical solution, preferably comprising a mixture of buffered oxide etch (BOE) and diluted hydrofluoric acid (DHF) at concentrations between 10:1 and 500:1, and spun while the etch is performed. The wafer may be situated horizontally and spun horizontally or situated, for example, vertically and spun vertically. In the illustrated embodiment, the wet spin etch removes between about 100 and about 300 angstroms of oxide. Spinning the wafer while the wet etch is performed can cause more etchants to interact with the trench sidewalls 39 than the trench base 41 due for example to the apparent centrifugal forces caused by the spinning motion and variances in chemical flow.

Tuning or adjusting the spin speed can facilitate a greater selectivity in etching between the trench sidewalls 39 and trench base 41, thereby adjusting the apparent centrifugal force in relation to the force of gravity. The tuning of the centrifugal and gravitational forces may be utilized to adjust the chemical flow for selective etching, so that, for example, the thickness of the first oxide layer 45 is reduced at a greater rate and/or to a greater extent at the trench sidewalls 39 than at the trench base 41. For instance, less chemical soaking may occur at the trench base 41 than at the trench sidewalls 39 during the spin etch, and/or greater etching may occur at the trench sidewalls 39 from augmented chemical flow driven by the centrifugal force.

When the wafer is situated horizontally and spun horizontally, by increasing the spin speed the centrifugal force increases with relation to gravity, and therefore the lateral etch rate increases with relation to the vertical etch rate, thus decreasing a resulting aspect ratio. By increasing the spin speed, the thickness of the first oxide layer 45 can be reduced at a greater rate and/or to a greater extent at the tops of the trench sidewalls 39 compared to the bottoms of the trench sidewalls 39. By decreasing the spin rate, the apparent centrifugal force decreases with relation to gravity, decreasing the lateral etch rate with relation to the vertical etch rate, and thus relatively increasing the resulting aspect ratio.

Wet-spin etch recipes may be generated wherein the recipe is based upon one or more determined geometric characteristics, such as aspect ratio, first oxide layer depth, or a thickness of the first oxide layer. A primary parameter in the generation of the wet spin etch recipe can be the spin rate. For example, if the geometric characteristic of concern is the aspect ratio, then a higher spin rate may be used for trenches having larger aspect ratios, compared to spin rates that are selected for trenches having relatively small aspect ratios.

Figure 6A:
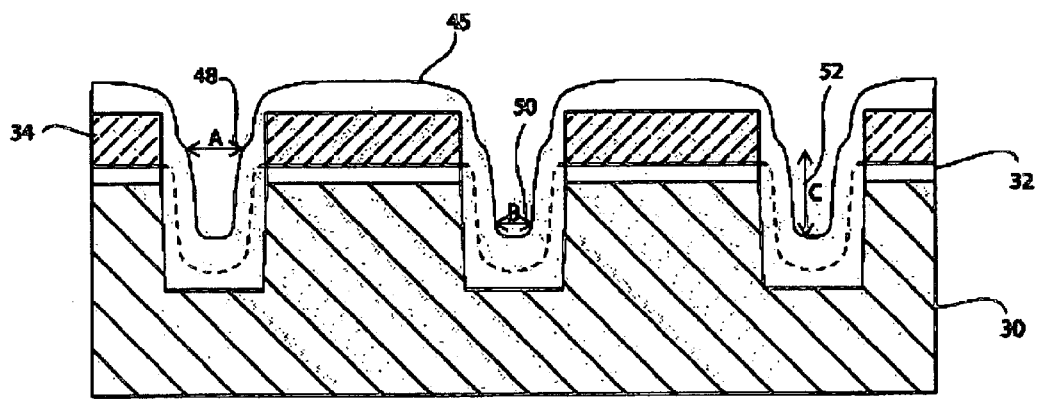
FIG. 6a is a cross-sectional view of FIG. 5 following a spin etch procedure.
Figure 6B:
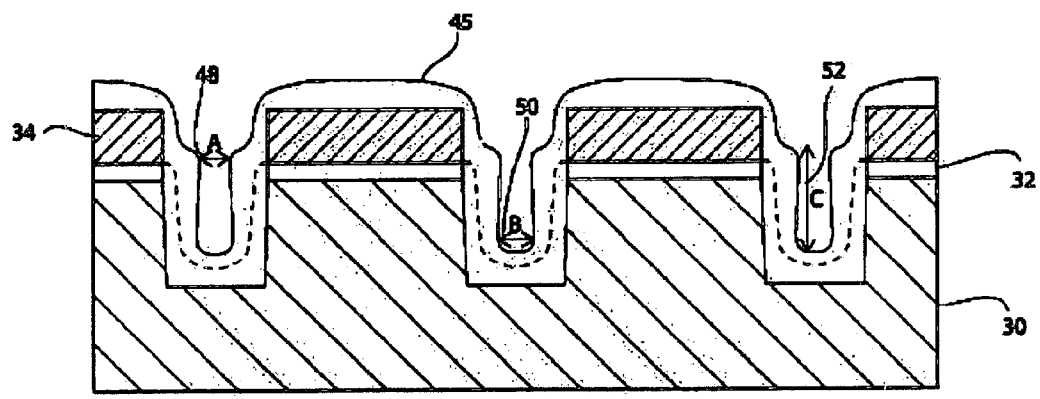
FIG. 6b is a prior art cross-sectional view similar to FIG. 6a, in which a standard etch procedure has been performed.

FIG. 6a Illustrates a cross-sectional view depicting the first oxide layer 45 after the wet spin etch has been performed in accordance with the present invention, and FIG. 6b depicts a prior art construction of the first oxide layer 45 after completion of a standard wet dip etch. The wet spin etch of the present invention can be performed on trenches disposed anywhere on the wafer from the center to the edge. In one embodiment, similar results can be obtained for various trench locations on the wafer even though the varying locations may experience different centrifugal forces. In accordance with an aspect of the invention, a relatively large rotating speed can enhance the centrifugal force (i.e., driving force) relative to the force of natural gravity. In accordance with another aspect, the driving force with the viscosity characterization from chemicals can also reduce the relative force of gravity. Thus, the efficacy of the wet spin etch may be tuned by adjusting, for example, one or more of the spin speed and the chemical composition and/or viscosity. The wet spin etch efficacy may also be tuned in other embodiments by adjusting the trench location on the wafer. Although horizontally disposed in the illustrated embodiment, the wafer may, for example, be vertically disposed in a modified embodiment. Thus, the wet spin etch efficacy may additionally be tuned by adjusting the spin-axis or axes of the wafer. In a vertical-type wafer orientation, corresponding to a horizontal spin-axis, the recipe can be set up in a pre-rotation or slow-rotation mode while the chemistry dispenses, to thereby reduce the relative force of gravity. Various spin rates, viscosities, and/or spin axes, for example, can be implemented at different points in time in a given wet-spin etch process in any of the above embodiments.

Standard practice in the art is to perform a wet dip etch after the first oxide layer 45 has been formed. A standard wet dip etch comprises submerging the wafer in a chemical bath for a period of time to isotropically etch the first oxide layer 45. A goal of the etch is to widen the distance between the trench sidewalls 39, i.e., a distance A 48 and a distance B 50, with minimal change or increase to the depth of the trench, i.e., a distance C 52, thus providing a relatively small aspect ratio (depth/width). Preferably the trench sidewalls 39 are etched such that distance A 48 is greater than distance B 50 to counteract the problem of reentrance.

A comparison of FIGS. 6a and 6b elucidates advantages associated with a wet spin etch in accordance with the present invention. Utilizing a wet spin etch (FIG. 6a) in place of the conventional wet dip etch (FIG. 6b) may attenuate or eliminate the aspect ratio problem by selectively increasing or maximizing for example distance A 48, while reducing or minimizing an increase in the distance C 52. The wet spin etch may additionally attenuate or eliminate the problems of reentrance associated with narrow trenches.

By reducing or minimizing the aspect ratio, problems associated with trenches that exhibit a high aspect ratio may be avoided. Such problems can occur because the lateral deposition rate on the trench sidewalls 39 must be taken into consideration in addition to the vertical deposition rate on the trench base 41. Deposition rates can be higher along the upper portions of the trench sidewalls 39 than the lower portions of the trench sidewalls 39 or the trench base 41. Therefore trenches may become occluded or blocked at the upper portions of the trench sidewalls 39, whereby reactants no longer reach the lower portions of the trenches, before the trenches have filled completely. Voids or air gaps can thus be formed that may cause electrical failures in devices adjacent to the affected trench.

Figure 7A:
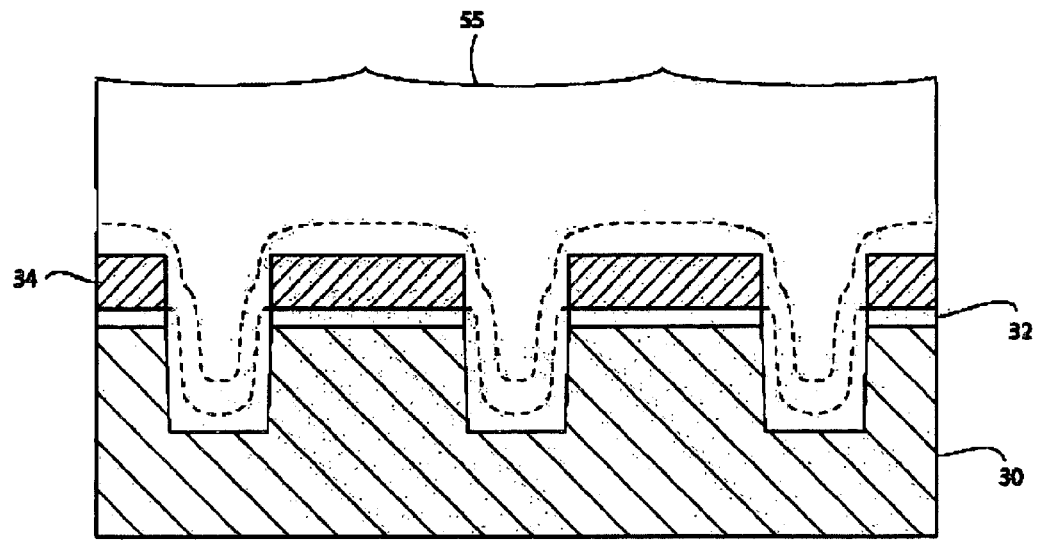
FIG. 7a is a cross-sectional view of FIG. 6a after a second oxide deposition.
Figure 7B:
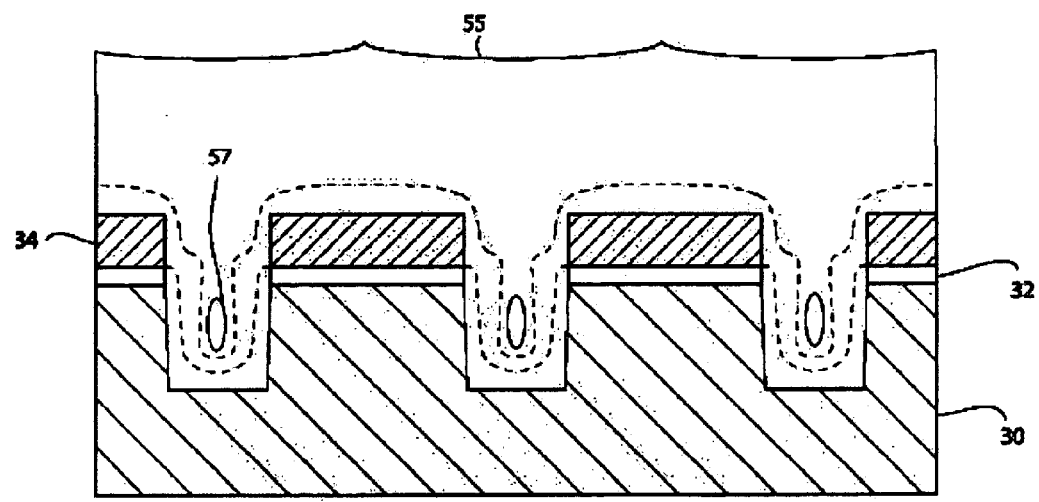
FIG. 7b is a prior art cross-sectional view of FIG. 6b after a second oxide deposition.

FIGS. 7a and 7b show a cross-sectional view of the isolation trenches previously illustrated in FIGS. 6a and 6b, respectively, after a second oxide deposition has been performed to form a second oxide layer 55. The second oxide deposition may be performed using processes such as by low pressure chemical vapor deposition (LPCVD), high density plasma chemical vapor deposition (HDPCVD), or plasma enhanced chemical vapor deposition (PECVD) and is preferably deposited by HDPCVD with an $SiH_4$ and $O_2$ mixture. In the illustrated embodiment, the second oxide deposition is performed in two steps. In the first step, 80 to 140 SCCM of $SiH_4$ is flowed and 130 to 200 SCCM of $O_2$ is flowed, while in the second step 110 to 180 SCCM of $SiH_4$ is flowed and 180 to 250 SCCM of $O_2$ is flowed. In FIG. 7a the trenches have been substantially completely, and preferably completely, filled in to form isolation trenches having good electrical characteristics. In the prior-art depiction of FIG. 7b air gaps or voids 57 have formed near the trench base 41, which may later cause device failure for adjacent transistors, capacitors, etc. In modified embodiments, the second oxide layer 55 may be substituted with other dielectric materials such as silicon oxynitride.

Figure 8:
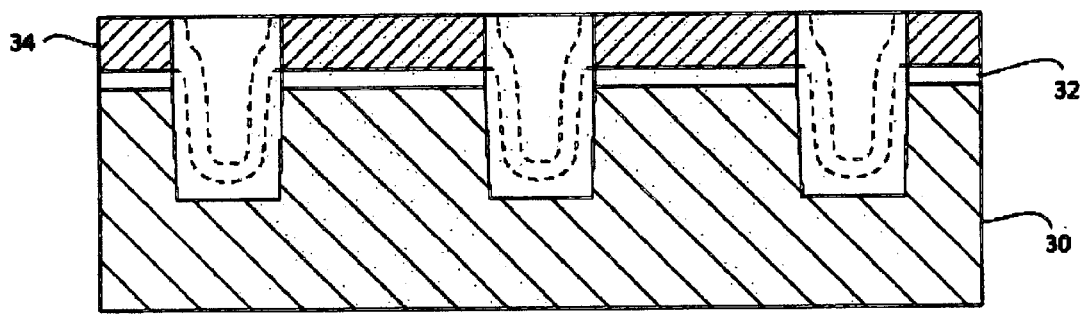
FIG. 8 is a cross-sectional view similar to FIG. 7a after a CMP procedure has been performed.

Following the deposition of the second oxide layer 55, chemical mechanical planarization (CMP) can be performed to planarize the surface of the wafer. The nitride layer 34 can act as a polish stop during the CMP process, preventing the further removal of oxide, nitride, silicon, etc., from the wafer. FIG. 8 depicts a cross-sectional view of FIG. 7a after CMP has been performed. Subsequent to the deposition of the second oxide layer, but prior to the CMP process, an optional anneal may be performed to increase densification of the oxides and thus minimize their etch rate during subsequent processing steps.

Figure 9:
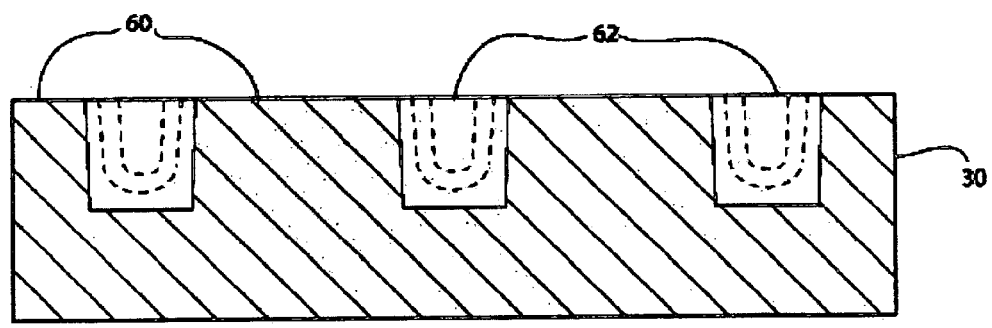
FIG. 9 is a cross-sectional view similar to FIG. 8 after a subsequent etch procedure.

After the CMP process the wafer may be treated by a wet etch such as with $H_3PO_4$ to remove the nitride layer 34 and pad oxide layer 32 as shown in FIG. 9. The resulting wafer is substantially planar and has a plurality of active regions 60 separated by a plurality of isolation trenches 62, in which the plurality of isolation trenches 62 are free of voids 57.

In view of the foregoing, it will be understood by those skilled in the art that the method of the present invention can facilitate formation of STI structures or other isolation trenches. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variation and modifications, however, fall well within the scope of the present invention as set forth in the following claims.

What is claimed is:

1. A method of forming at least one isolation trench for an integrated circuit on a semiconductor substrate, the method comprising:

providing a semiconductor substrate having at least one trench disposed therein;

forming a first ill layer within the at least one trench;

etching back the first fill layer with a wet spin etch; and forming a second fill layer over the first fill layer.

2. The method as set forth in claim 1, wherein the providing of a substrate having at least one trench disposed therein comprises:

providing a substrate having a pad oxide layer, a nitride layer, and a patterned photoresist layer; and removing portions of the nitride layer, pad oxide layer, and semiconductor substrate to form at least one trench.

3. The method as set forth in claim 2, wherein:

the portions of the nitride layer, pad oxide layer, and semiconductor substrate are removed using an anisotropic etch; and the forming of a first fill layer is preceded by removing the patterned photoresist layer and forming an oxide liner in the trench.

4. The method as set forth in claim 2, wherein the portions of the nitride layer, pad oxide layer, and semiconductor substrate are removed by means of an anisotropic etch followed by an isotropic etch.

5. The method as set forth in claim 2, wherein the first fill layer comprises an oxide formed by HDPCVD with $SiH_4$.

6. The method as set forth in claim 5, wherein a mixture of $SiH_4$ and $O_2$ are implemented to form the oxide, the $SiH_4$ flow ranging from 50 to 100 SCCM, and the $O_2$ flow ranging from 80 to 150 SCCM.

7. The method as set forth in claim 6, wherein a formation time of the first fill layer ranges from 10 to 30 seconds.

8. The method as set forth in claim 2, wherein the second fill layer comprises an oxide formed by HDPCVD, PECVD, or LPCVD.

9. The method as set forth in claim 8, wherein the formation of the second fill layer comprises a first step of flowing 80 to 140 SCCM of $SiH_4$ and 130 to 200 SCCM of $O_2$, and a second step of flowing 110 to 180 SCCM of $SiH_4$ and 180 to 250 SCCM of $O_2$.

10. The method as set forth in claim 2, wherein the spin speed of the wafer during the wet spin etch is increased to create a wider top trench size and a lower step height, thereby creating a lower aspect ratio.

11. The method as set forth in claim 2, wherein one dimension of the at least one trench ranges from about 0.24 to about 0.20 $\mu$m.

12. The method as set forth in claim 2, wherein the wet spin etch comprises a mixture of BOE and DHF, the chemical composition ranging from a ratio of about 10:1 to about 500:1.

13. The method as set forth in claim 12, wherein between 100 angstroms and 300 angstroms of oxide are removed during the wet spin etch.

14. The method as set forth in claim 2, wherein the wafer is situated horizontally and spun horizontally during the wet spin etch.

15. The method as set forth in claim 2, wherein the wafer is situated vertically and spun vertically during the wet spin etch.

16. The method as set forth in claim 2, wherein the at least one trench comprises a plurality of trenches.

17. A method of filling an isolation trench, comprising:
    (a) determining a geometrical characteristic of the isolation trench; and
    (b) generating a wet-spin etch recipe to be used in a deposition 1, wet spin etch, deposition 2 trench filling sequence, wherein the wet-spin etch recipe is generated based upon the determined geometrical characteristic.

18. The method as set forth in claim 17, wherein the geometric characteristic is an aspect ratio of the isolation trench.

19. The method as set forth in claim 17, wherein the generating of a wet-spin etch recipe comprises selecting a spin rate.

20. The method as set forth in claim 17, wherein greater spin rates are selected for isolation trenches having relatively large aspect ratios, and smaller spin rates are selected for trenches having relatively small aspect ratios.

21. A method of filling isolation trenches, comprising, not necessarily in sequence:
    (a) performing a deposition 1, wet spin etch, deposition 2 trench filling sequence to fill a first trench having a first aspect ratio; and
    (b) performing a deposition 1, wet spin etch, deposition 2 trench filling sequence to fill a second isolation trench having a second aspect ratio;
    wherein the first aspect ratio is greater than the second aspect ratio; and
    wherein a spin rate of the wet spin etch in (a) is greater than a spin rate of the wet spin etch in (b).

22. A method of forming at least one isolation trench on a semiconductor substrate, the method comprising:
    providing a semiconductor substrate having at least one trench disposed therein, the at least one trench having a trench sidewall and a trench base;
    forming a first fill layer inside the at least one trench;
    performing a selective etch process wherein portions of the first fill layer on the trench sidewall are removed at a greater rate than a rate at which portions of the first fill layer on the trench base are removed; and
    forming a second fill layer over the first fill layer.

\* \* \* \* \*